United States Patent [19]

Fletcher et al.

[11] 4,088,951
[45] May 9, 1978

[54] MICROCOMPUTERIZED ELECTRIC FIELD METER DIAGNOSTIC AND CALIBRATION SYSTEM

[76] Inventors: James C. Fletcher, Administrator of the National Aeronautics and Space Administration, with respect to an invention of; Larry D. Holley; Jerry W. Mason, both of Merritt Island, Fla.

[21] Appl. No.: 780,874

[22] Filed: Mar. 24, 1977

[51] Int. Cl.² ............................................ G01R 35/02
[52] U.S. Cl. .................................... 324/130; 324/32; 324/74
[58] Field of Search ...................... 324/130, 74, 32, 95; 325/67

[56] References Cited

U.S. PATENT DOCUMENTS

| | | | |
|---|---|---|---|
| 3,409,829 | 11/1968 | Elmore et al. | 324/74 |
| 3,486,113 | 12/1969 | Foster | 324/130 |

*Primary Examiner*—Rudolph V. Rolinec

*Assistant Examiner*—Ernest F. Karlsen
*Attorney, Agent, or Firm*—James O. Harrell; John R. Manning

[57] ABSTRACT

A computerized field meter calibration system which includes an apparatus for testing the calibration of field meters normally utilized for measuring electromagnetic field potential. A reference voltage is applied to the field meter for causing signals to be produced on the output terminals thereof. A bank of relays is provided for selectively connecting output terminals of the field meter to a multiplexer by means of a digital voltmeter and an oscilloscope. A frequency-shift-keyed receiver is also connected to one of the terminals of the field meter for transmitting and converting a frequency shift keyed signal to a digital signal which is, subsequently, applied to the multiplexer. A microprocessor is used for generating coded command signals to the bank of relays and also to the multiplexer for controlling the comparison of the output signals with information stored within the microprocessor to determine if the field meter is properly calibrated.

5 Claims, 1 Drawing Figure

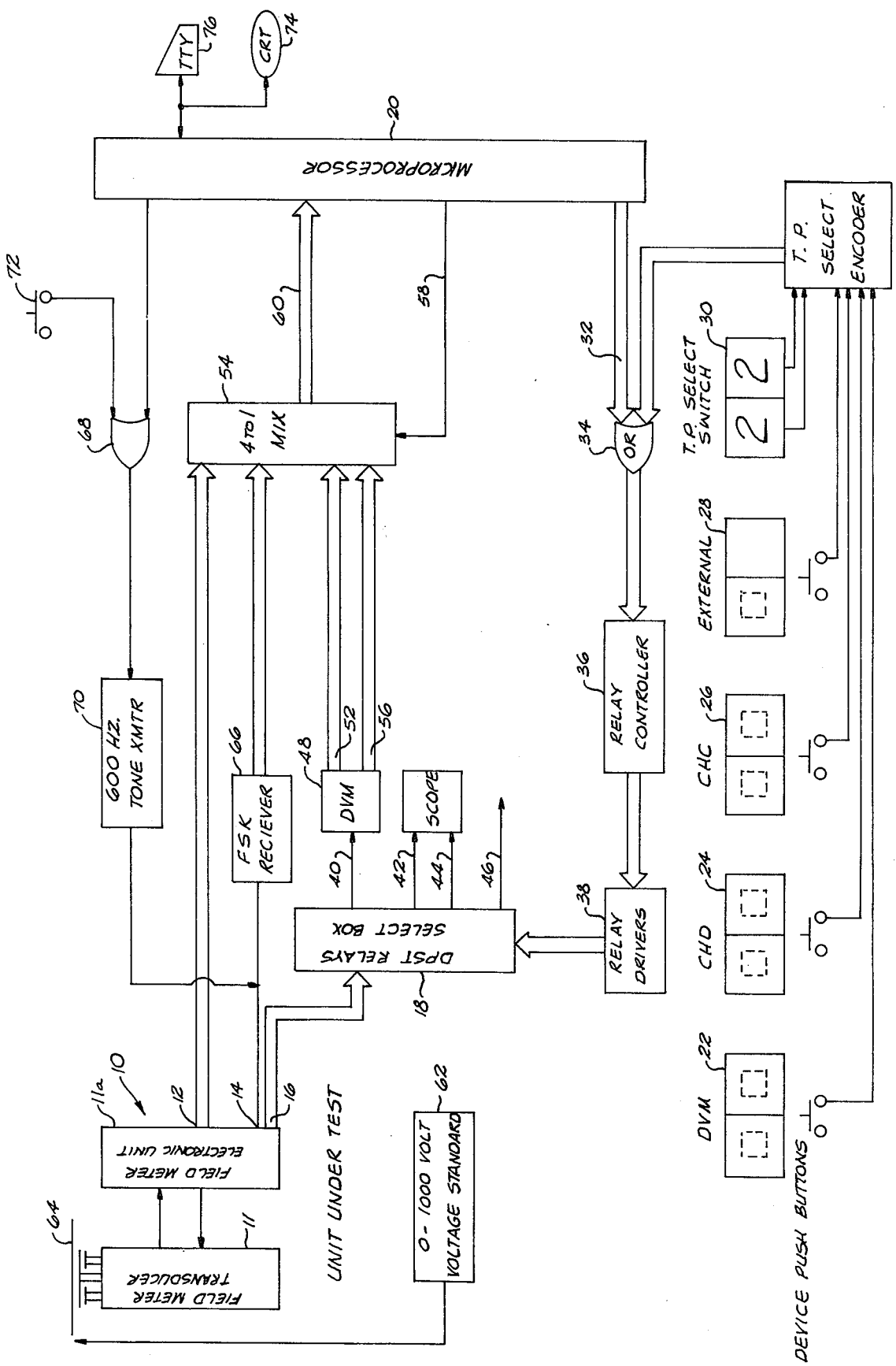

MICROCOMPUTERIZED ELECTRIC FIELD METER DIAGNOSTIC AND CALIBRATION SYSTEM

ORIGIN OF THE INVENTION

The invention described herein was made in performance of work under a NASA contract and is subject to provisions of Section 305 of the National Aeronautics and Space Act of 1968, Public Law 85-568 (72 Stat. 435, 402 U.S.C.P. 2457).

BACKGROUND OF THE INVENTION

The present invention relates to a calibration device and, more particularly, to a microcomputerized electric field meter diagnostic and calibration system.

Heretofore, electric field meters were generally manually calibrated. One problem with such methods was that it required skilled personnel and introduced the problem of human error. The manual operation was time consuming and required very close adherence to the calibration procedure in order to accurately and properly calibrate the meters.

SUMMARY OF THE INVENTION

This invention relates to an apparatus for testing the calibration of a field meter which has output terminals upon which signals are produced in the form of digital signals, analog voltages, and frequency-shift-keyed signals. The apparatus includes placing a standard voltage or reference signal on the field meter for causing signals to be produced on the output terminals of the field meter. A multiplexer is provided for selectively receiving the signals from the field meter and, upon command, feeding such to a microprocessor. A frequency-shift-keyed receiver means is connected between the multiplexer and the output terminal upon which frequency-shift-keyed signals appear for converting the frequency-shift-keyed signals to digital signals and supplying the digital signals to the multiplexer. Each of a plurality of relays is connected between a respective output terminal of the field meter and a signal processing device for selectively coupling a signal from a respective output terminal to a signal processing device upon being energized. At least one of the signal processing devices is a digital voltmeter which produces a readout as well as converts analog signals received from the terminals to digital signals. The microprocessor includes means for generating command signals for selectively energizing the relays for connecting the signals on selected terminals to the multiplexer and also means for supplying command signals to the multiplexer causing signals received thereby to be transferred to the microprocessor for being compared with stored information.

The microprocessor is a conventional item with the capability of storing information against which the signals being received from the field meter being calibrated are compated. A cathode ray tube terminal is connected to the microprocessor for visually displaying the information being received during the test so that an operator can determine whether such is within predetermined limits. Other conventional devices such as printouts and recorders may be connected to the microprocessor.

Accordingly, it is an important object of the present invention to provide a simple and relatively inexpensive device for accurately calibrating electric field meters.

Another important object of the present invention is to provide a system which is operated by a microprocessor for automatically checking the output signals at various terminals of a field meter for calibrating the field meter.

Still another important object of the present invention is to provide an apparatus which can rapidly calibrate field meters while minimizing human error.

Still another important object of the present invention is to provide a calibration system wherein relatively unskilled personnel can be utilized for calibrating electric field meters.

These and other objects and advantages of the invention will become apparent upon reference to the following specification, attendant claims and drawing.

BRIEF DESCRIPTION OF THE DRAWING

The drawing illustrates a block diagram of a microcomputerized electric field meter diagnostic and calibration system constructed in accordance with the present invention.

BRIEF DESCRIPTION OF THE INVENTION

Referring in more detail to the drawing, there is illustrated an apparatus for calibrating an electric field meter such as generally designated by the reference character 10. The field meter 10 includes a transducer 11 which senses an electric field and an electronic unit 11a which produces signals on its output terminals responsive to the electric field. These signals appearing on the output terminals are in digital from, in frequency-shift-keyed form, and in analog form. In the particular meter 10, the digital signals appear on terminal 12; the frequency-shift-keyed signals appear on terminal 14; and the analog signals appear on terminal 16. In addition to the test points 12, 14 and 16 illustrated, there are other test points for the field meter which produce various signals that may be in the form of sinusoidal waves, digital or analog signals that are desired to be checked in order to properly and accurately calibrate the entire field meter.

Furthermore, it is normally desired to check calibration of the power supply used with the field meter. All of this information is coupled to test points such as indicated in FIG. 1 as by the reference character 16. Each of these test points has a separate conductor connected thereto which is, in turn, connected to a respective relay carried within a relay selection box 18.

In order to understand how the apparatus automatically checks out a particular test point associated with the field meter 10, one particular test point will be selected to be tested. A microprocessor 20, which may be any suitable microprocessor that normally includes storage facilities, is programmed so that it can automatically select and sample the various test points of the field meter 10 in a predetermined sequence. This is accomplished by means of command signals. In addition to utilizing the microprocessor for automatically sampling or selecting the test points, the test points can be manually selected by use of push buttons 22 through 28 in combination with a select switch 30. Such will be discussed more fully below.

Assuming that microprocessor 20 has been programmed to select a particular one of the test terminals indicated by the reference character 16, a coded signal is fed over lead 32 through an OR gate 34 to a relay controller 36. The relay controller 36 is a logic circuit which, according to the coded information being supplied from the microprocessor 20, connects or closes one of the relays provided in the relay selection box 18 for coupling the particular test terminal to the output terminals associated with the select box 18.

It is to be understood, of course, that the relay selection box includes one relay for each of the terminals of the field meter. It is also noted that the relay controller 36 energizes the particular relay carried within the selection box through a relay driver 38.

The coded information being supplied by the microprocessor 20 energizes the relay associated with the selected test point. This, in turn, causes the test point to be coupled through the particular relay of the relay bank 18 to output channels 40, 42, 44, and 46. As illustrated, there are two signal processing devices connected to the outputs 40, 42, and 44 of the relay select box 18. They are a digital volt meter 48 and an oscilloscope 50. The digital voltmeter 48 not only produces an output reading but also converts the analog signals appearing on the lead 40 to digital signals on its output lead 52. Simultaneously, it produces a functional signal on its output lead 56. This functional signal indicates the polarity and whether or not the voltage is A.C. or D.C. If the information is coupled to the oscilloscope, of course, it merely displays the analog signal appearing on leads 42 and 44. Other external equipment may be connected to external lead 46.

The microprocessor then sends a command signal over lead 58 to the multiplexer 54 causing a range function signal appearing on lead 56 to be connected or fed through the multiplexer to lead 60 for being analyzed by the microprocessor 20. After this takes place, the multiplexer 54 automatically connects the digital information coming in on lead 52 to the output channel 60 for being analyzed and compared by the microprocessor 20. It is to be understood that when it is described that the information is being analyzed in the microprocessor 20, such can also be stored and later compared with known voltages. Furthermore, if the signals being fed to the microprocessor 20 exceed certain tolerances when compared to the stored information, alarms are activated indicating that the field meter needs calibrating.

Prior to the calibration of the field meter 10, a standard voltage source 62 is coupled to a calibration plate 64 which is positioned a predetermined distance above the field meter for simulating a particular electric field. This known simulated electric field produces a given voltage at a test terminal of the field meter if such is properly calibrated.

The microprocessor 20 can also send a command signal over lead 48 for directly connecting the information appearing on the output terminals 12 and 14 of the field meter. It is noted that the output terminal 14 of the field meter is connected through a frequency-shift-keyed receiver 66 which converts a frequency-shift-keyed signal appearing on terminal 14 into a digital signal. This digital signal is fed directly to the multiplexer 54 and on to the microprocessor 20. Digital signals produced by the field meter 10 and appearing on terminal 12 can be fed directly to the multiplexer without any conversion. When it is desired to interrogate the frequency-shift-keyed signal appearing on the output terminal 14 of the field meter, normally such is done in response to a command signal. This command signal is in the form of a 600 Hertz tone which is generated responsive to a command signal being fed out from the microprocessor through OR gate 68 to the tone generator 70. This tone is fed to the field meter and acts as an enabling signal for permitting the frequency-shift-keyed signal to pass through the frequency-shift-keyed receiver 66.

When it is desired to manually select the particular mode to be analysed, one of the switches, 22, 24, 26 or 28 is manually operated. In addition to manually operating one of the selection switches 24 through 28 which indicates a particular mode desired; that is, whether it is a digital signal, channel D on the oscilloscope, channel C on the oscilloscope, or external, a thumbwheel switch 30 is utilized for selecting the particular relay in relay box 18. The combination of the switch 30 and one of the pushbuttons 22 through 28 produces a signal comparable to the coded signal produced by the microprocessor and fed through the OR gate 34.

It is also to be understood that the tone for testing the frequency-shift-keyed circuit may be produced manually by depressing pushbutton 72 which is connected to the OR gate 68 rather than utilizing the microprocessor for activating the tone generator 70.

A cathode ray tube terminal 74 may be connected to the microprocessor for visually displaying the information being received during the test so that an operator can determine whether such is within predetermined limits. Also connected to the microprocessor may be other external devices such as printouts 76 and/or recorders.

While a preferred embodiment of the invention has been described using specific terms, such description is for illustrative purposes only, and it is to be understood that changes and variations may be made without departing from the spirit or scope of the following claims.

What is claimed is:

1. An apparatus for testing the calibration of a field meter having output terminals upon which signals are produced in the form of digital signals, analog voltages, and frequency-shift-keyed signals, said apparatus comprising:
    (a) means for applying a reference signal to said field meter causing signals to be produced on said output terminals of said meter,
    (b) a multiplexer;
    (c) a frequency-shift-keyed receiver means connected between said multiplexer and said output terminal upon which said frequency-shift-keyed signals appear for converting said frequency-shift-keyed signals to digital signals and supplying said digital signals to said multiplexer;
    (d) a plurality of signal processing devices;
    (e) a plurality of relays, each being connected between a respective output terminal of said field meter and a signal processing device for selectively coupling a signal from a respective output terminal to a signal processing device upon being energized;
    (f) means for connecting signals from said signal processing devices to said multiplexer; and
    (h) a microprocessor, said microprocessor including:
    (i) means for generating command signals for selectively energizing said relays for connecting signals on selected terminals to said multiplexer, and
    (ii) means for supplying command signals to said multiplexer causing signals received thereby to be transferred to said microprocessor for being compared with stored information.

2. The apparatus as set forth in claim 1 wherein at least one of said signal processing devices is a digital voltmeter for producing a readout and converting analog signals received from said terminals to digital signals.

3. The apparatus as set forth in claim 1 wherein one of said signal processing devices is an oscilloscope.

4. The apparatus as set forth in claim 3 further comprising:
   means for producing a tone command signal for enabling said frequency-shift-keyed signal produced by said field meter to be transferred through said frequency-shift-keyed receiver to said multiplexer.

5. The apparatus as set forth in claim 1 further comprising:
   means for manually generating command signals for selectively energizing said relays.

* * * * *